US 9,779,823 B2

United States Patent
Schmier et al.

(10) Patent No.: US 9,779,823 B2
(45) Date of Patent: Oct. 3, 2017

(54) SECURE ERASE OF NON-VOLATILE MEMORY

(71) Applicant: SanDisk Technologies LLC, Plano, TX (US)

(72) Inventors: Jacob B. Schmier, Gilbert, AZ (US); Robert W. Ellis, Phoenix, AZ (US); James M. Higgins, Chandler, AZ (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/195,931

(22) Filed: Jun. 28, 2016

(65) Prior Publication Data

US 2017/0194052 A1    Jul. 6, 2017

Related U.S. Application Data

(60) Provisional application No. 62/275,536, filed on Jan. 6, 2016.

(51) Int. Cl.
| | | |
|---|---|---|
| *G11C 16/04* | (2006.01) | |
| *G11C 16/14* | (2006.01) | |
| *G11C 16/10* | (2006.01) | |

(52) U.S. Cl.
CPC .............. *G11C 16/14* (2013.01); *G11C 16/10* (2013.01)

(58) Field of Classification Search
CPC ......... G11C 16/10; G11C 16/16; G11C 16/14; G06F 12/0246
USPC ............. 365/185.29, 185.25, 185.28, 185.26
See application file for complete search history.

(56) References Cited

U.S. PATENT DOCUMENTS

| 9,142,315 | B2 * | 9/2015 | Mu ..................... G11C 11/5621 |
|---|---|---|---|
| 9,343,172 | B2 * | 5/2016 | Mu ..................... G11C 16/3459 |
| 9,436,594 | B2 * | 9/2016 | Hars ................... G06F 12/0246 |
| 2007/0189080 | A1 | 8/2007 | Liu et al. |
| 2010/0023675 | A1 | 1/2010 | Chen et al. |
| 2012/0300554 | A1 | 11/2012 | Goss et al. |
| 2013/0070527 | A1 | 3/2013 | Sabbag et al. |
| 2013/0301353 | A1 | 11/2013 | Twitto et al. |

FOREIGN PATENT DOCUMENTS

WO    WO 2015/077625    5/2015

OTHER PUBLICATIONS

International Search Report and Written Opinion dated Sep. 20, 2016, received in International Application No. PCT/US2016/036717, which corresponds to U.S. Appl. No. 14/929,179, 13 pages (Yang).

(Continued)

*Primary Examiner* — David Lam
(74) *Attorney, Agent, or Firm* — Brinks, Gilson & Lione

(57) ABSTRACT

In a non-volatile memory system, a fast bulk secure erase method for erasing data includes, in response to a secure erase command: applying charge to a portion of non-volatile memory in the non-volatile memory system, and performing an erase operation sufficient to remove charge from the portion of non-volatile memory to below an erase threshold. The applied charge is sufficient to program memory cells in the portion of non-volatile memory to above a pre-erase program threshold.

20 Claims, 9 Drawing Sheets

(56) References Cited

OTHER PUBLICATIONS

Michael Wei et al., "Reliably Erasing Data From Flash-Based Solid State Drives", Department of Computer Science and Engineering, University of California, San Diego, Dec. 17, 2010, pp. 1-13.
International Search Report and Written Opinion dated Jun. 20, 2017 for corresponding International Application No. PCT/US2016/066374.

* cited by examiner

SECURE ERASE OF NON-VOLATILE MEMORY

RELATED APPLICATIONS

This application claims priority to U.S. Provisional Patent Application No. 62/275,536, filed Jan. 6, 2016, which is hereby incorporated by reference in its entirety.

TECHNICAL FIELD

The disclosed embodiments relate generally to memory systems, and in particular, to fast bulk secure erasing in a non-volatile memory system (e.g., comprising one or more flash memory devices).

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Erasing data from some types of non-volatile memory may require lengthy overwriting operations. In some instances, the erase process may leave remnant data, which can be recovered. Therefore, it would be desirable to erase data quickly as well as securely, such that erased data cannot be recovered.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description," one will understand how the aspects of various embodiments are used to enable fast bulk secure erasing in memory devices.

The disclosed device and method enable improved and secure erasing of non-volatile memory, such as flash memory. In response to a secure erase command, charge sufficient to enable secure erase is applied to non-volatile memory cells in the device, using a pre-erase programming operation. Thereafter, charge is removed from the non-volatile memory to securely erase the non-volatile memory.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

Figure 1A:
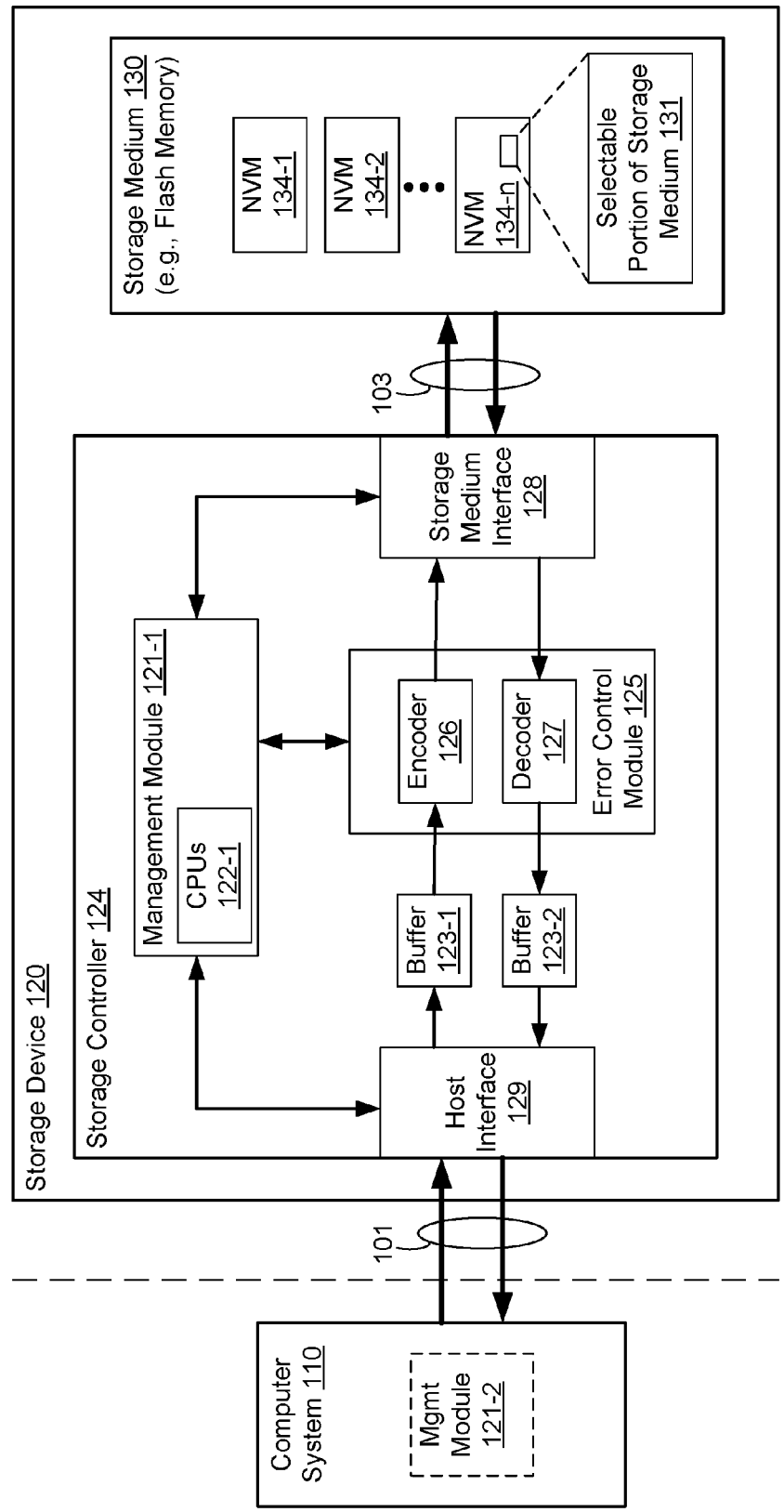
FIG. 1A is a block diagram illustrating an implementation of a non-volatile memory system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable fast bulk secure erasing in memory devices. Some implementations include systems, methods and/or devices to erase data quickly and securely.

(A1) More specifically, some embodiments include a method of erasing data in a non-volatile memory system. The method includes, in response to a secure erase command: (1) applying charge to a portion of non-volatile memory in the non-volatile memory system, and (2) performing an erase operation sufficient to remove charge from the portion of non-volatile memory to below an erase threshold. The applied charge is sufficient to program memory cells in the portion of non-volatile memory to above a pre-erase program threshold.

(A2) In some embodiments of the method of A1, applying charge to the portion of non-volatile memory applies charge to all programmable memory cells in the portion of non-volatile memory.

(A3) In some embodiments of the method of any of A1-A2, applying charge to the portion of non-volatile memory applies a programming operation to all memory cells in the portion of non-volatile memory.

(A4) In some embodiments of the method of any of A1-A3, applying charge to the portion of non-volatile memory includes using one or more charge pulses having a cumulative effect sufficient to program the memory cells in the portion of non-volatile memory to above the pre-erase program threshold.

(A5) In some embodiments of the method of any of A1-A4, applying charge to the portion of non-volatile memory programs all programmable memory cells in the portion of non-volatile memory to a non-data state.

(A6) In some embodiments of the method of any of A1-A5, applying charge to the portion of non-volatile memory applies a same programming voltage across the memory cells in the portion of the non-volatile memory.

(A7) In some embodiments, the method of any of A1-A6 further includes repeating the method for each of a plurality of non-volatile memory portions to erase data in each of the plurality of non-volatile memory portions.

(A8) In some embodiments of the method of A7, the plurality of non-volatile memory portions includes all non-volatile memory portions containing data from a host system.

(A9) In some embodiments of the method of any of A7-A8, the plurality of non-volatile memory portions includes non-volatile memory portions other than non-volatile memory portions containing memory metadata.

(A10) In some embodiments of the method of any of A1-A9, the memory cells in the portion of non-volatile memory each store one of N distinct data values as a cell voltage, wherein the N distinct data values correspond to N sequential voltage ranges and N-1 threshold voltages for distinguishing the N distinct data values, and the pre-erase program threshold is at least as high as a lowest one of the N-1 threshold voltages.

(A11) In another aspect, a non-volatile memory system includes a storage medium, one or more processors, and memory storing one or more programs, which when executed by the one or more processors cause the non-volatile memory system to, in response to a secure erase command: (1) apply charge to a portion of non-volatile memory in the non-volatile memory system, and (2) perform an erase operation sufficient to remove charge from the portion of non-volatile memory to below an erase threshold. The applied charge is sufficient to program memory cells in the portion of non-volatile memory to above a pre-erase program threshold.

(A12) In some embodiments of the non-volatile memory system of A11, the one or more processors comprise one or more processors of a storage controller and the one or more programs include a pre-erase program module that applies charge to the portion of non-volatile memory in the non-volatile memory system and a secure erase module that performs an erase operation sufficient to remove charge from the portion of non-volatile memory to below the erase threshold.

(A13) In some embodiments of the non-volatile memory system of any of A11-A12, the one or more programs include instructions that when executed by the one or more processors cause the non-volatile memory system to perform the method of any of A1-A10, described above.

(A14) In yet another aspect, a non-volatile memory system includes a storage medium, one or more processors, and memory storing one or more programs, which when executed by the one or more processors cause the non-volatile memory system to perform the method of any of A1-A10, described above.

(A15) In yet another aspect, a non-transitory computer readable storage medium stores one or more programs configured for execution by one or more processors of a non-volatile memory system, the one or more programs including instructions that when executed by the one or more processors cause the non-volatile memory system to perform the method of any of A1-A10, described above.

(A16) In yet another aspect, a non-volatile memory system includes: (1) means for applying, in response to a secure erase command, charge to a portion of non-volatile memory in the non-volatile memory system, and (2) means for performing, in response to the secure erase command, an erase operation sufficient to remove charge from the portion of non-volatile memory to below an erase threshold. The applied charge is sufficient to program memory cells in the portion of non-volatile memory to above a pre-erase program threshold.

(A17) In yet another aspect, the non-volatile memory system of A16 is further configured to perform the method of any of A1-A10, described above.

Numerous details are described herein to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1A is a block diagram illustrating an implementation of a non-volatile memory system 100 (sometimes called a data storage system), in accordance with some embodiments. While some example features are illustrated, various other features have not been illustrated for the sake of brevity and so as not to obscure pertinent aspects of the example embodiments disclosed herein. To that end, as a non-limiting example, non-volatile memory system 100 includes a storage device 120 (also sometimes called an information storage device, or a data storage device, or a memory device), which includes a storage controller 124 and a storage medium 130, and is used in conjunction with or includes a computer system 110 (e.g., a host system or a host computer). In some embodiments, storage medium 130 is a single flash memory device while in other embodiments storage medium 130 includes a plurality of flash memory devices. In some embodiments, storage medium 130 is NAND-type flash memory or NOR-type flash memory. In some embodiments, storage medium 130 includes one or more three-dimensional (3D) memory devices. Further, in some embodiments, storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, non-volatile memory system 100 includes one or more storage devices 120.

Computer system 110 is coupled to storage controller 124 through data connections 101. However, in some embodiments, computer system 110 includes storage controller 124, or a portion of storage controller 124, as a component and/or as a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch-screen display, a mouse, a track-pad, a digital camera, and/or any number of supplemental I/O devices to add functionality to computer system 110. In some embodiments, computer system 110 does not have a display and other user interface components.

Storage medium 130 is coupled to storage controller 124 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 124 and storage medium 130 are included in the same device (i.e., an integrated device) as components thereof. Furthermore, in some embodiments, storage controller 124 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices (e.g., NVM 134-1, NVM 134-2 through NVM 134-n) including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers.

Memory devices (e.g., NVM 134-1, NVM 134-2, etc.) of storage medium 130 include addressable and individually selectable blocks, such as selectable portion of storage medium 131 (also referred to herein as selected portion 131). In some embodiments, the individually selectable blocks (sometimes called erase blocks) are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the flash memory device.

In some embodiments, storage controller 124 includes a management module 121-1, a host interface 129, an input buffer 123-1, an output buffer 123-2, an error control module 125 and a storage medium I/O interface 128. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Similarly, storage medium I/O 128 provides an interface to storage medium 130 though connections 103. In some embodiments, storage medium I/O 128 includes read and write circuitry, including circuitry capable of providing reading signals to storage medium 130 (e.g., reading threshold voltages for NAND-type flash memory).

In some embodiments, management module 121-1 includes one or more processing units 122-1 (sometimes herein called CPUs, processors, or hardware processors, and sometimes implemented using microprocessors, microcontrollers, or the like) configured to execute instructions in one or more programs (e.g., in management module 121-1). In some embodiments, the one or more CPUs 122-1 are shared by one or more components within, and in some cases, beyond the function of storage controller 124. Management module 121-1 is coupled to host interface 129, error control module 125 and storage medium I/O 128 to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

Error control module 125 is coupled to storage medium I/O 128, input buffer 123-1, output buffer 123-2, and management module 121-1. Error control module 125 is provided to limit the number of uncorrectable errors inadvertently introduced into data during writes to memory or reads from memory. In some embodiments, error control module 125 is executed in software by the one or more CPUs 122-1 of management module 121-1, and, in other embodiments, error control module 125 is implemented in whole or in part using special purpose circuitry to perform data encoding and decoding functions. To that end, in some embodiments, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123-1 receives data to be stored in storage medium 130 from computer system 110. The data held in input buffer 123-1 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands (e.g., via data connections 101) to storage controller 124 requesting data from storage medium 130. Storage controller 124 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 123-2, where the decoded data is made available to computer system 110. In some embodiments, if the decoding is not successful, storage controller 124 may resort to a number of remedial actions or provide an indication of an irresolvable error condition.

Figure 1B:
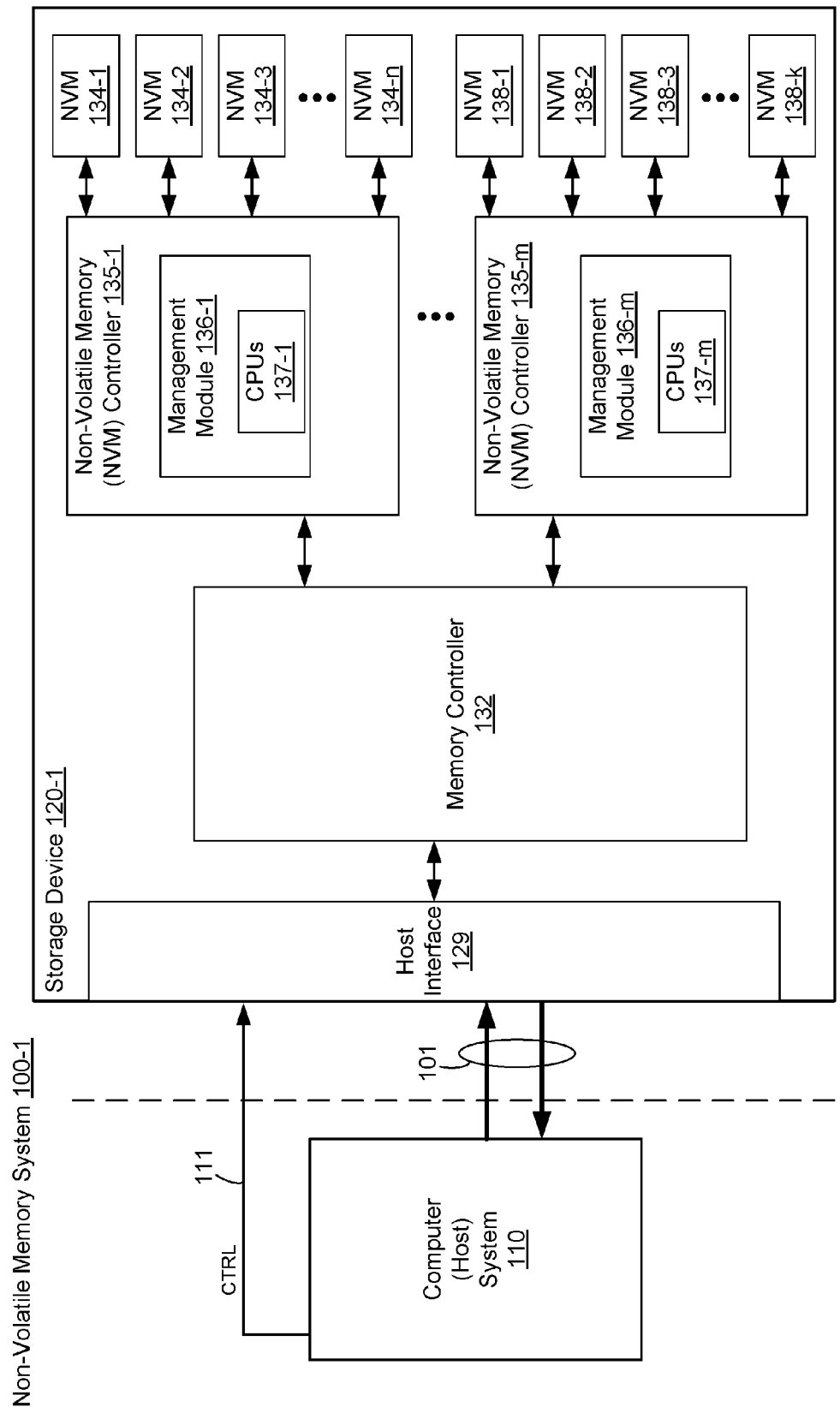
FIG. 1B is a block diagram illustrating an implementation of a non-volatile memory system, in accordance with some embodiments.

FIG. 1B is a block diagram illustrating an implementation of a non-volatile memory system 100-1, in accordance with some embodiments. While some exemplary features are illustrated, various other features have not been illustrated for the sake of brevity and so as not to obscure more pertinent aspects of the example implementations disclosed herein. To that end, as a non-limiting example, non-volatile memory system 100-1 includes storage device 120-1, which includes host interface 129, memory controller 132, one or more non-volatile memory controllers (e.g., non-volatile memory controller(s) 135), and non-volatile memory (e.g., one or more non-volatile memory device(s) 134, 138), and is used in conjunction with computer system 110. Storage device 120-1 may include various additional features that have not been illustrated for the sake of brevity and so as not to obscure more pertinent features of the example implementations disclosed herein, and a different arrangement of features may be possible. Host interface 129 provides an interface to computer system 110 through data connections 101, and optionally through a control bus or connection 111 as well.

Memory controller 132 is coupled to host interface 129, and non-volatile memory controllers 135. In some implementations, during a write operation, memory controller 132 receives data from computer system 110 through host interface 129 and during a read operation, memory controller 132 sends data to computer system 110 through host interface 129. Further, host interface 129 provides additional data, signals, voltages, and/or other information needed for communication between memory controller 132 and computer system 110. In some embodiments, memory controller 132 and host interface 129 use a defined interface standard for communication, such as double data rate type three (DDR3), typically used for communications with certain types of synchronous dynamic random access memory (e.g., DDR3 SDRAM). In some embodiments, memory controller 132 and non-volatile memory controllers 135 use a defined interface standard for communication, such as serial advance technology attachment (SATA). In some other implementations, the device interface used by memory controller 132 to communicate with non-volatile memory controllers 135 is SAS (serial attached SCSI), or other storage interface. In some implementations, memory controller 132 includes one or more processing units (sometimes herein called CPUs, processors, or hardware processors, and sometimes implemented using microprocessors, microcontrollers, or the like) configured to execute instructions in one or more programs (e.g., in memory controller 132). In some implementations, the one or more processors are shared by one or more components within, and in some cases, beyond the function of memory controller 132.

In some embodiments, the non-volatile memory controllers 135 include management modules 136. In some embodiments, the management modules 136 each include one or more processing units 137 (sometimes herein called CPUs, processors, or hardware processors, and sometimes implemented using microprocessors, microcontrollers, or the like) configured to execute instructions in one or more programs (e.g., in management module 136). In some embodiments, each management module 136 implements some or all of the functions and features described herein with respect to management module 121-1.

Figure 2:
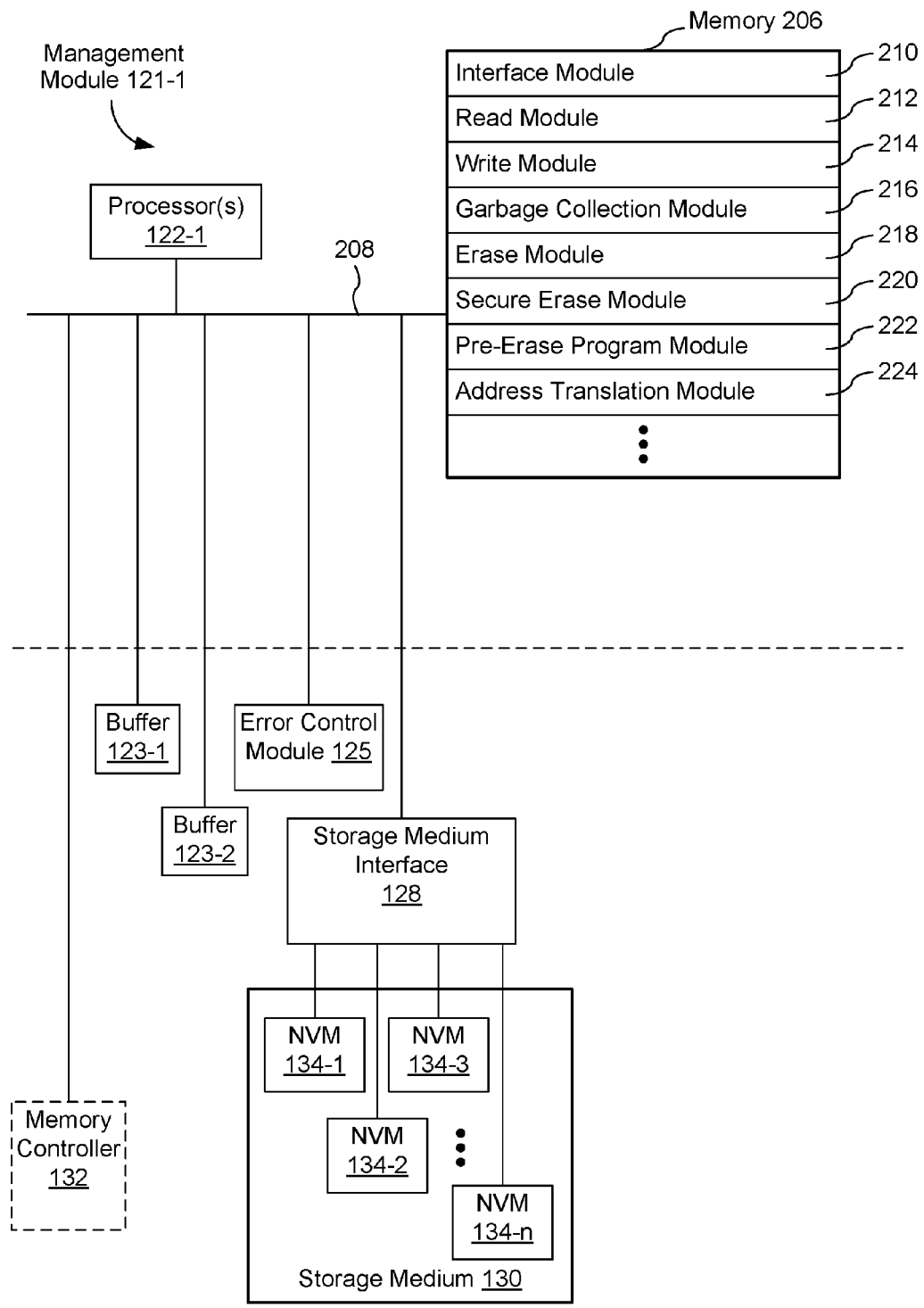
FIG. 2 is a block diagram illustrating a memory management module of a non-volatile memory controller, in accordance with some embodiments.

FIG. 2 is a block diagram illustrating an implementation of a management module 121-1, 121-2, 136-1, or 136-m (hereinafter management module 121 unless specifically designated otherwise), in accordance with some embodiments. Management module 121 typically includes one or more processing units 122-1 (sometimes herein called CPUs, processors, or hardware processors, and sometimes implemented using microprocessors, microcontrollers, or the like) for executing modules, programs and/or instructions stored in memory 206 and thereby performing processing operations; memory 206 (sometimes herein called controller memory); and one or more communication buses 208 for interconnecting these components. Communication buses 208 optionally include circuitry (sometimes called a chipset) that interconnects and controls communications between system components. In some embodiments, such as those represented by FIG. 1A, management module 121 is coupled to buffers 123-1 and 123-2, error control module 125, and storage medium I/O 128 by communication buses 208. In some embodiments, such as those represented by FIG. 1B, management module 136 is coupled to memory controller 132 and non-volatile memory devices 134 or 138 by communication buses 208. It is noted that the components represented in FIG. 2 may vary depending on the configuration of a particular non-volatile memory system, and that the representations shown in FIG. 2, configured according to FIGS. 1A and 1B, are merely non-limiting examples. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from processor(s) 122-1. Memory 206, or alternately the non-volatile memory device(s) within memory 206, comprises a non-transitory computer readable storage medium. In some embodiments, memory 206, or the computer readable storage medium of memory 206, stores the following programs, modules, and data structures, or a subset or superset thereof:

- an interface module 210 used for communicating with other components, such as non-volatile memory devices 134, and computer system 110;
- a read module 212 used for reading from non-volatile memory devices 134;
- a write module 214 used for writing to non-volatile memory devices 134;
- a garbage collection module 216 used for controlling a garbage collection process in a storage medium (e.g., storage medium 130, FIG. 1A);
- an erase module 218 used for erasing data written to non-volatile memory devices 134;
- a secure erase module 220 used for securely erasing data written to non-volatile memory devices 134;

a pre-erase program module 222 used for programming non-volatile memory devices prior to secure erasing;

an address translation module 224 that is used for mapping logical addresses to physical addresses.

Each of the above identified elements may be stored in one or more of the previously mentioned memory devices that together form memory 206, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below with reference to FIGS. 5 and 6A-6B.

Although FIG. 2 shows management module 121-1, FIG. 2 is intended more as a functional description of the various features that may be present in a management module, or non-volatile memory controller, than as a structural schematic of the embodiments described herein. In practice, and as recognized by those of ordinary skill in the art, items shown separately could be combined and some items could be separated. Further, as noted above, in some embodiments, one or more modules of management module 121-1 are implemented in management module 121-2 of computer system 110, FIG. 1A, or management modules 136-1 through 136-m, FIG. 1B.

As discussed below with reference to FIG. 3A, a single-level flash memory cell (SLC, also referred to as X1) stores one bit ("0" or "1"). Thus, the storage density of an SLC memory device is one bit of information per memory cell. A multi-level flash memory cell (MLC, also referred to as X2), however, can store two or more bits of information per cell by using different ranges within the total voltage range of the memory cell to represent a multi-bit bit-tuple. In turn, the storage density of an MLC memory device is multiple-bits per cell (e.g., two bits per memory cell).

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, typically mean the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1," and otherwise the raw data value is a "0."

Figure 3A:
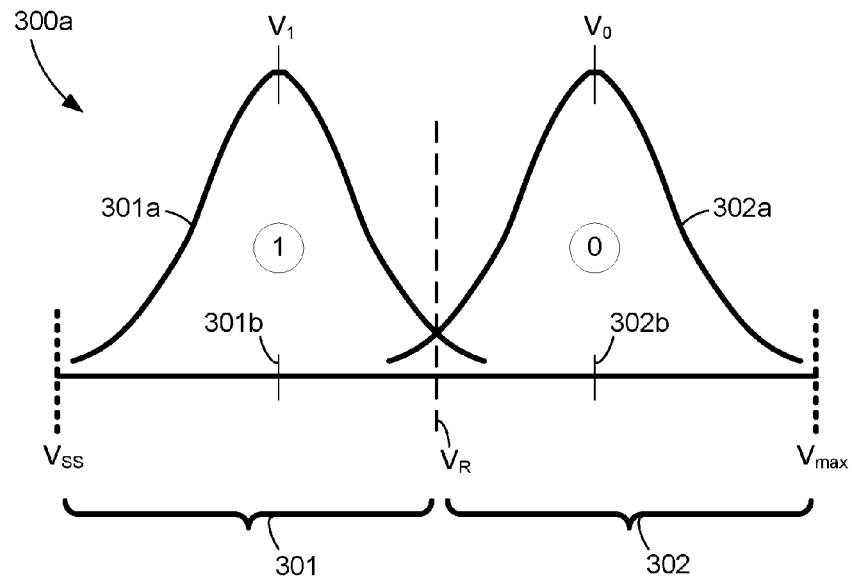
FIG. 3A is a prophetic diagram of voltage distributions that may be found in a set of single-level flash memory cells (SLC) over time, in accordance with some embodiments.

FIG. 3A is a simplified, prophetic diagram of voltage distributions 300a found in a set of single-level flash memory cells (SLC) over time, in accordance with some embodiments. The voltage distributions 300a shown in FIG. 3A have been simplified for illustrative purposes. In this example, the SLC's cell voltage range extends approximately from a first voltage, $V_{SS}$ (e.g., 0 volts), to a maximum allowed gate voltage, $V_{max}$ (e.g., 6 volts). As such, voltage distributions 300a extend between $V_{SS}$ and $V_{max}$. In some embodiments, the voltage distributions 300a may represent a histogram of cell voltages corresponding to SLC memory cells in a respective portion (e.g., a page, word line or block) of flash memory.

Sequential voltage ranges 301 and 302 between voltages $V_{SS}$ and $V_{max}$ are used to represent corresponding bit values "1" and "0," respectively. Each voltage range 301, 302 has a respective center voltage $V_1$ 301b, $V_0$ 302b. As described below, in many circumstances the memory cell current sensed in response to an applied reading threshold voltages is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In order to increase storage density in flash memory, flash memory has developed from single-level (SLC) cell flash memory to multi-level cell (MLC) flash memory so that two or more bits can be stored by each memory cell. As discussed below with reference to FIG. 3B, an MLC flash memory device is used to store multiple bits by using voltage ranges within the total voltage range of the memory cell to represent different bit-tuples. An MLC flash memory device is typically more error-prone than an SLC flash memory device created using the same manufacturing process because the effective voltage difference between the voltages used to store different data values is smaller for an MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 3B, the impact of such errors can be reduced by gray-coding the data, such that adjacent voltage ranges represent single-bit changes between bit-tuples.

Figure 3B:
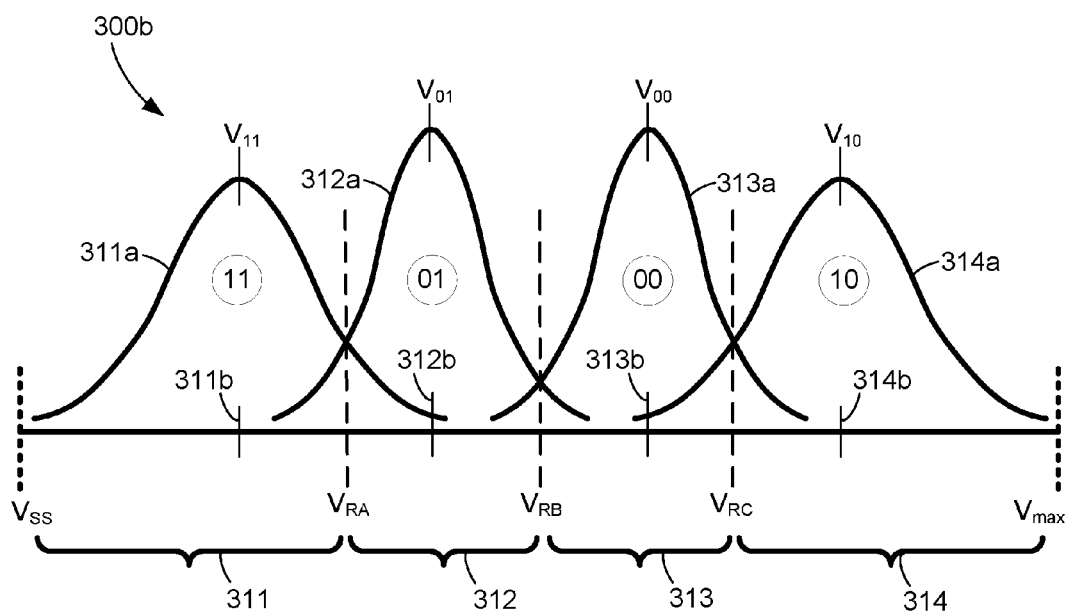
FIG. 3B is a prophetic diagram of voltage distributions that may be found in a set of multi-level flash memory cells (MLC) over time, in accordance with some embodiments.

FIG. 3B is a simplified, prophetic diagram of voltage distributions 300b found in a set of multi-level flash memory cells (MLC) over time, in accordance with some embodiments. The voltage distributions 300b shown in FIG. 3B have been simplified for illustrative purposes. In this example, the MLC's cell voltage range extends approximately from a first voltage, $V_{SS}$, to a maximum allowed gate voltage, $V_{max}$. As such, voltage distributions 300b extend between $V_{SS}$ and $V_{max}$. In some embodiments, the voltage distributions 300b may represent a histogram of cell voltages corresponding to MLC memory cells in a respective portion (e.g., a page, word line or block) of flash memory.

Sequential voltage ranges 311, 312, 313, 314 between voltages $V_{SS}$ and $V_{max}$ are used to represent corresponding bit-tuples "11," "01," "00," "10," respectively. Each voltage range 311, 312, 313, 314 has a respective center voltage 311b, 312b, 313b, 314b. Each voltage range 311, 312, 313, 314 also has a respective voltage distribution 311a, 312a, 313a, 314a that may occur as a result of any number of a combination of factors, such as electrical fluctuations, defects in the storage medium, operating conditions, device history (e.g., number of program-erase (PE) cycles performed during the lifetime of the device or lifetime of a respective memory portion, and/or number of read operations performed since the last erase operation on the respective memory portion), and/or imperfect performance or design of write-read circuitry.

Ideally, during a write operation, the charge on the floating gate of the MLC would be set such that the resultant cell voltage is at the center of one of the ranges 311, 312, 313, 314 in order to write the corresponding bit-tuple to the MLC. Specifically, the resultant cell voltage would be set to one of $V_{11}$ 311b, $V_{01}$ 312b, $V_{00}$ 313b and $V_{10}$ 314b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 311, 312, 313, 314. Optionally, in some implementations, the reading threshold voltages are located between adjacent voltage ranges 311, 312, 313, 314. In some implementations, reading threshold voltages $V_{RA}$, $V_{RB}$, and $V_{RC}$ are applied in the regions proximate to where adjacent voltage distributions 311a, 312a, 313a, 314a overlap, which are not necessarily proximate to the halfway regions between adjacent center voltages $V_{11}$ 311b, $V_{01}$ 312b, $V_{00}$ 313b and $V_{10}$ 314b. In some implementations, the reading threshold voltages are selected or adjusted to minimize error. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 311b, $V_{01}$ 312b, $V_{00}$ 313b or $V_{10}$ 314b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 301 and 302 are respectively "11" and "01," the corresponding bit-tuples for adjacent ranges 302 and 303 are respectively "01" and "00," and the corresponding bit-tuples for adjacent ranges 303 and 304 are respectively "00" and "10." Using gray-coding, if the cell voltage drifts close to a read comparison voltage level, the error is typically limited to a single bit within the 2-bit bit-tuple.

Although the description of FIG. 3B uses an example in which q=2 (i.e., 2 bits per cell in an MLC flash memory), those skilled in the art will appreciate that the embodiments described herein may be extended to memory cells that have more than four possible states per cell, yielding more than two bits of information per cell. For example, in some embodiments, a triple-level memory cell (TLC, also referred to as X3) has eight possible states per cell, yielding three bits of information per cell. As another example, in some embodiments, a quad-level memory cell (QLC, also referred to as X4) has 16 possible states per cell, yielding four bits of information per cell. As another example, in some embodiments, a cell might store only 6 states, yielding approximately 2.5 bits of information per cell, meaning that two cells together would provide 36 possible states, more than sufficient to store 5 bits of information per pair of cells.

It is noted that each voltage level shown in FIG. 3A and FIG. 3B corresponds to a charge level or amount of charge on the floating gate of one or more respective flash memory cells, and thus FIGS. 3A and 3B can be considered to be prophetic diagrams of floating gate charge distributions found in a set of flash memory cells, where the charge levels are measured in terms the resulting cell voltages.

FIGS. 4A-4E are conceptual diagrams of the distributions of memory cell voltages during pre-erase program (also referred to as pre-erase or pre-program before erase) operations performed on a storage device, in accordance with some embodiments. More specifically, FIGS. 4A-4E represent simplified, prophetic diagrams of voltage distributions found in a multi-level flash memory cell (MLC) having 2 bits per cell. It will be understood that numerous flash memory configurations, having various numbers of bits per cells, can be used (e.g., 1 bit per cell (SLC), 2 bits per cell (MLC), 3 bits per cell (TLC), etc.). As shown, the prophetic diagrams each have an X-axis and a Y-axis. The X-axis corresponds to cell voltages for the non-volatile memory cells (e.g., flash memory cells) in a portion 131 of storage medium 130 (e.g., an individually selectable block, and more generally a selectable portion 131 of storage medium 130, FIG. 1A). The Y-axis corresponds to a number of non-volatile memory cells in the portion 131 of storage medium 130 having each cell voltage shown along the X-axis.

Figure 4A:
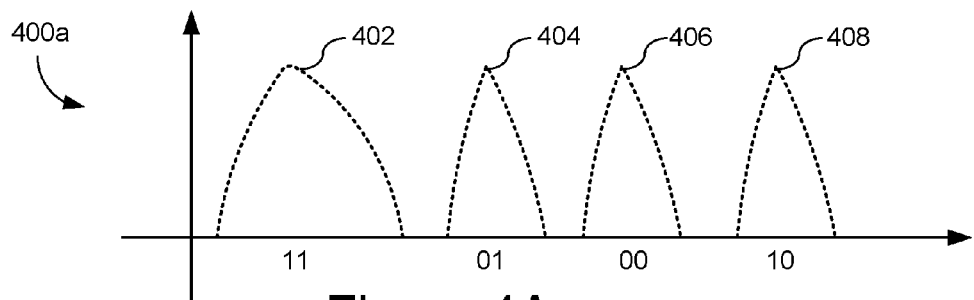
FIGS. 4A-4E are conceptual diagrams showing aspects of secure erasing in a non-volatile memory system, in accordance with some embodiments.

FIG. 4A is a conceptual diagram of the distribution of memory cell voltages in the selected portion 131 (e.g., a block, or group of blocks) of storage medium 130 in a programmed state 400a, prior to the start of a pre-erase program operation, in accordance with some embodiments. Memory cell voltage distribution 402 corresponds to erased memory cells or memory cells storing a value of "11," memory cell voltage distribution 404 corresponds to memory cells storing a value of "01," memory cell voltage distribution 406 corresponds to memory cells storing a value of "00," and memory cell voltage distribution 408 corresponds to memory cells storing a value of "10."

Figure 4B:
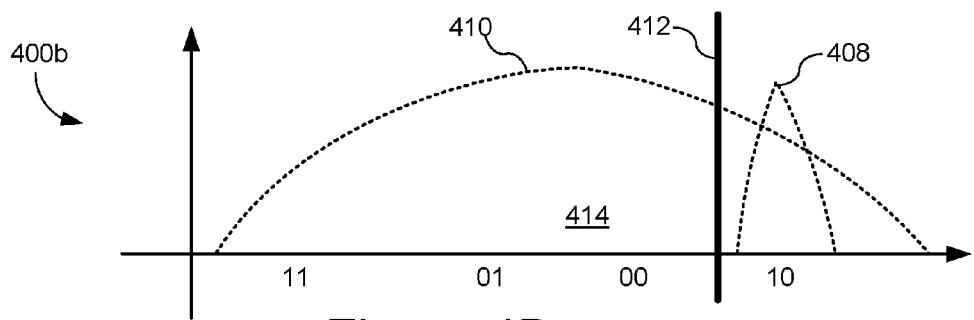

FIG. 4B is a conceptual diagram of the distribution of memory cell voltages in the same selected portion 131 (e.g., a block, or group of blocks) of storage medium 130 as in FIG. 4A, in a partially pre-erase programmed state 400b, during a pre-erase program operation, in accordance with some embodiments. FIG. 4B represents the distribution of memory cell voltages after a first phase or duration of the pre-erase program operation. During the pre-erase program operation, charge is applied or injected to non-volatile memory cells from the selected portion 131 of storage medium 130. During the pre-erase program operation, the cell voltages of the memory cells that previously corresponded to values "11," "01," "00," and "10," are increased, represented by a shift to the right in FIG. 4B. The amount by which each cell voltage changes during each phase of the pre-erase program operation varies, and FIG. 4B shows a conceptual diagram of the resulting distribution 410 of memory cell voltages.

Memory cells having a cell voltage above (i.e., to the right of) a pre-erase program threshold 412 are said to be pre-erase programmed or pre-programmed before erase, whereas memory cells 414 having a cell voltage below (i.e., to the left of) the pre-erase program threshold 412 are said to not be pre-erase programmed or to be not fully or not sufficiently pre-erase programmed. When all of the memory cells in the selected portion 131 have a charge level corresponding to a cell voltage above the pre-erase program threshold 412 (as shown in FIG. 4D, and further discussed below), the original data stored in those memory cells is obfuscated and the memory cells are ready for erasure.

Figure 4C:
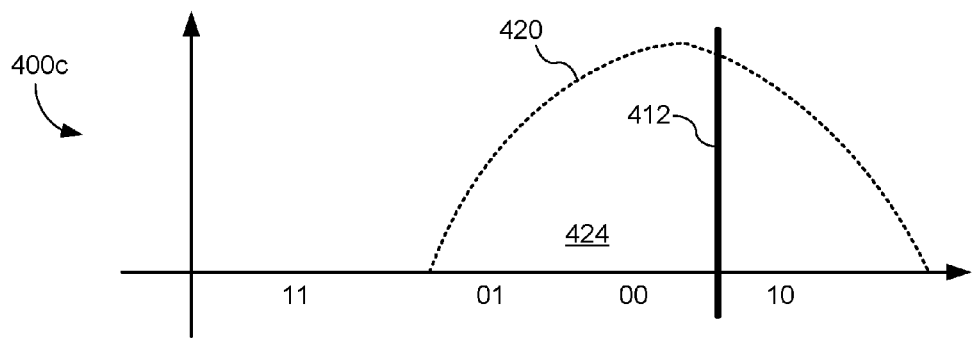

FIG. 4C is a conceptual diagram of the distribution of memory cell voltages in the same selected portion 131 (e.g., a block, or group of blocks) of storage medium 130 as in FIGS. 4A and 4B, in a partially pre-erase programmed state 400c, during a pre-erase program operation, in accordance with some embodiments. FIG. 4C represents the distribution of memory cell voltages after an additional phase or duration of the pre-erase program operation, and after state 400b as shown in FIG. 4B. During this additional phase or duration of the pre-erase program operation, charge is again applied or injected to non-volatile memory cells from the selected portion 131 of storage medium 130. In some embodiments, charge may be applied to non-volatile memory cells continuously during the pre-erase program operation. In some embodiments, charge may be applied periodically or non-periodically using one or more charge pulses. During the second erase phase, the cell voltages of the memory cells that previously corresponded to values "01," "00," and "10," are further increased, represented by a shift to the right in FIG. 4C. The amount by which each cell voltage changes during each phase of the erase operation varies, and FIG. 4C shows a conceptual diagram of the resulting distribution 420 of memory cell voltages.

As discussed above, memory cells having a cell voltage above (i.e., to the right of) the pre-erase program threshold 412 are said to be pre-erase programmed, whereas memory cells 424 having a cell voltage below (i.e., to the left of) the pre-erase program threshold 412 are said to not be pre-erase programmed.

Figure 4D:
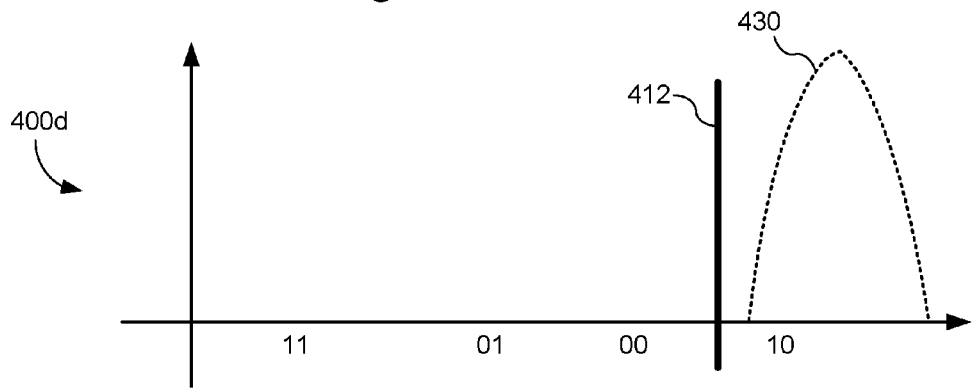

FIG. 4D is a conceptual diagram of the distribution 430 of memory cell voltages in the same selected portion 131 (e.g., a block, or group of blocks) of storage medium 130 as in FIGS. 4A-4C, in a fully pre-erase programmed state 400d, after the pre-erase program operation, in accordance with some embodiments. As discussed in more detail below, the duration of pre-erase programming or number of pre-erase programming phases required to achieve the fully pre-erase programmed state 400d may vary from device to device and even from block to block within a particular device (e.g., storage device 120, FIG. 1A). In the fully pre-erase programmed state 400d, memory cells in the selected portion 131 have cell voltages above the pre-erase program threshold 412. Furthermore, a number of memory cells in the selected portion 131 may have cell voltages above (i.e., to the right of) the cell voltages corresponding to value "10."

Figure 4E:
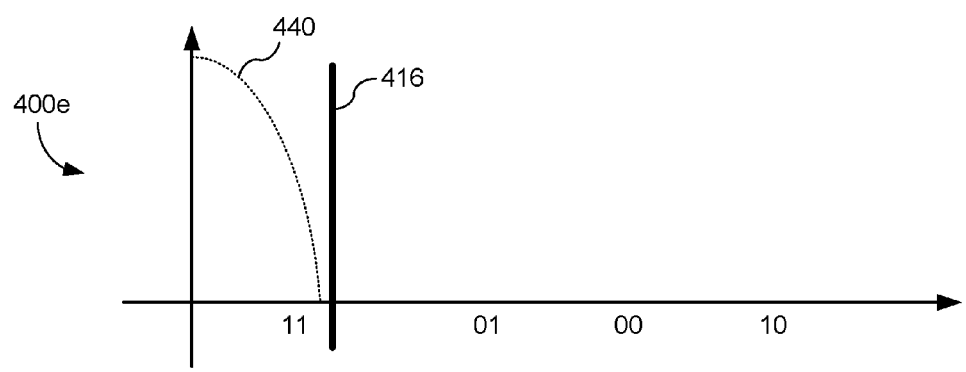

FIG. 4E is a conceptual diagram of the distribution 440 of memory cell voltages in the same selected portion 131 (e.g., a block, or group of blocks) of storage medium 130 as in FIGS. 4A-4D, in a fully erased or secure-erased state 400e, after the pre-erase program operation and after the erase operation, in accordance with some embodiments. As discussed in more detail below, the duration of erasing or number of erase phases required to achieve the fully secure-erased state 400e may vary from device to device and even from block to block within a particular device (e.g., storage device 120, FIG. 1A). In the fully secure-erased state 400e, memory cells in the selected portion 131 have cell voltages below the erase threshold 416.

It is noted that FIG. 4B is a conceptual diagram in which memory cell voltage distribution 408, representing memory cells already above the pre-erase threshold voltage prior to the pre-erase program operation, is shown separately from the memory cell voltage distribution of other memory cells. Alternately, a merged memory cell voltage distribution could have been shown in this Figure. It is further noted that FIGS. 4B-4D are conceptual diagrams in which pre-erase program threshold 412 is shown to be positioned at or near a threshold voltage corresponding to value "10" (e.g., reading threshold voltage $V_{RC}$, FIG. 3B).

The pre-erase program threshold 412 may alternately be at least as high as a lowest threshold voltage of a number of threshold voltages distinguishing distinct data values stored in the memory cells, where the distinct data values correspond to sequential voltage ranges. It is noted that the threshold voltage corresponding to value "10" is the third lowest threshold voltage of the sequence of threshold voltages distinguishing distinct data values stored in the memory cells, and that in various embodiments, the pre-erase program threshold 412 is at least as high as the lowest, second lowest, third lowest, fourth lowest (in embodiments having four or more reading threshold voltages), or highest threshold voltage of the sequence of threshold voltages distinguishing distinct data values stored in the memory cells. The pre-erase program threshold 412 may also be selected based on the requirements of the secure erase command, such as the level or degree of memory erasure that is required.

Similarly, because FIG. 4E is also a conceptual diagram, erase threshold 416 may alternately be positioned higher or lower than shown, and may be at or below the lowest threshold voltage of the number of threshold voltages distinguishing the distinct data values stored in the memory cells. Erase threshold 416 may also be selected based on the requirements of the secure erase command, such as the level or degree of memory erasure that is required.

Figure 5:
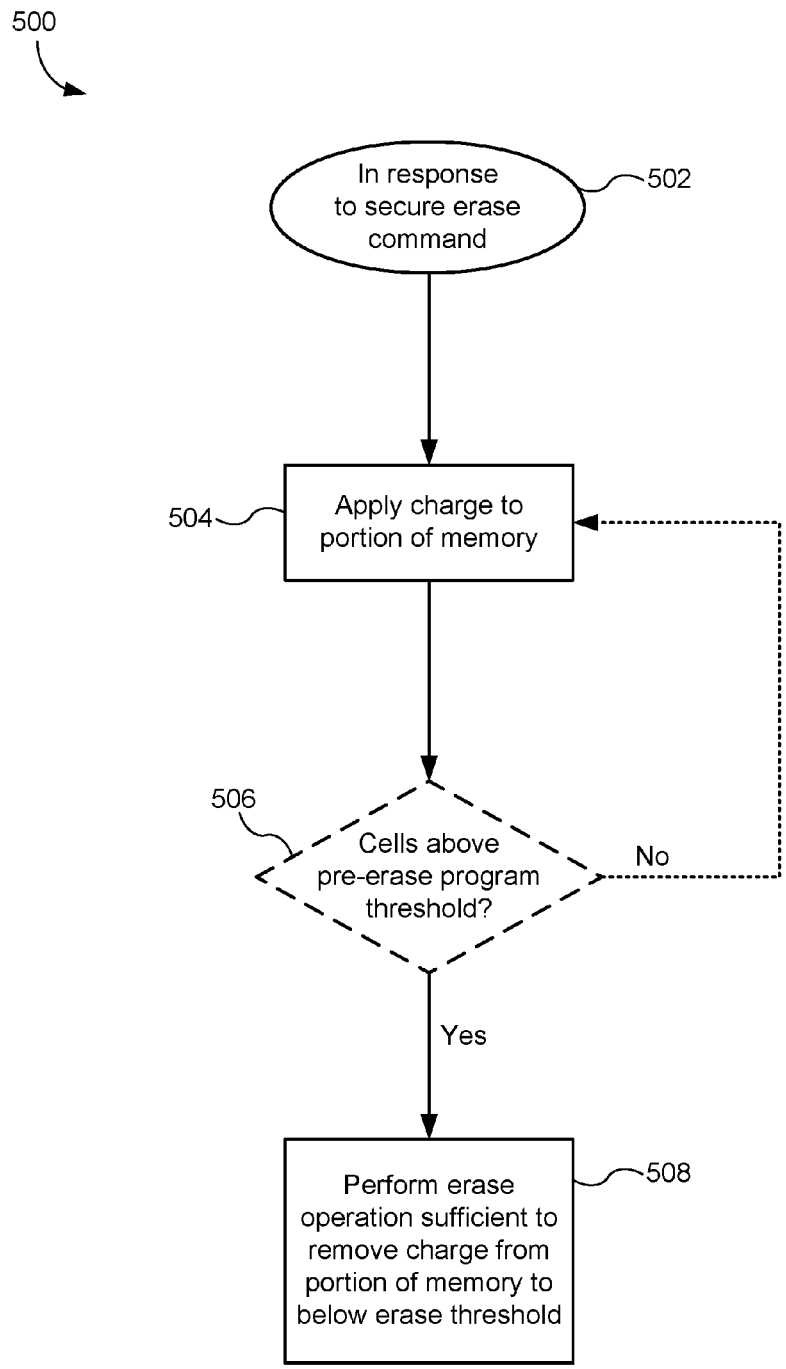
FIG. 5 illustrates a conceptual flowchart representation of a method of secure erasing in a non-volatile memory system, in accordance with some embodiments.

FIG. 5 illustrates a conceptual flowchart representation of a method of secure erasing in a non-volatile memory system 500, in accordance with some embodiments. With reference to the non-volatile memory system 100 pictured in FIGS. 1A and 1B, in some embodiments, the method 500 is performed by a storage device (e.g., storage device 120, FIGS. 1A and 1B) or one or more components of the storage device (e.g., storage controller 124 of storage device 120, FIG. 1A, memory controller 132 of storage device 120-1, FIG. 1B, or non-volatile memory controllers 135, FIG. 1B). In some embodiments, the method 500 is governed by instructions that are stored in a non-transitory computer readable storage medium and that are executed by one or more processors of a device, such as the one or more processing units (CPUs) 122-1 of management module 121-1 (FIG. 1A) or the one or more processing units (CPUs) 137 of management modules 136 (FIG. 1B).

In some embodiments, some of the operations (or alternatively, steps) of method 500 are performed at a host system (e.g., computer system 110, FIGS. 1A and 1B) that is operatively coupled with the storage device, and other operations of method 500 are performed at the storage device. In some of these embodiments, method 500 is governed, at least in part, by instructions that are stored in a non-transitory computer readable storage medium and that are executed by one or more processors (e.g., hardware processors) of the host system (the one or more processors of the host system are not shown in FIGS. 1A and 1B).

With reference to FIG. 2, in some embodiments, the operations of method 500 are performed, at least in part, by a secure erase module (e.g., secure erase module 220, FIG. 2), and a pre-erase program module (e.g., pre-erase program module 222, FIG. 2). For ease of explanation, the following describes method 500 as performed by a storage device (e.g., by storage device 120, FIG. 1A).

The method begins, in some embodiments, in response to a secure erase command (502) in the storage device (e.g., storage device 120, FIG. 1A). In some embodiments, the secure erase command is received from a host system (e.g., computer system 110, FIGS. 1A and 1B).

In response to the secure erase command, the storage device (e.g., storage device 120, FIG. 1A, or a component thereof such as management module 121-1, FIG. 1A), applies (504) charge to a portion of memory (e.g., selectable portion of storage medium 131, FIG. 1A), as part of a pre-erase program operation. In some embodiments, applying charge to the portion of memory applies charge to all programmable memory cells in the portion of memory so as to change the amount of charge on the floating gates of the programmable memory cells in the portion of memory. In other words, some memory cells in the portion of memory may be in a state such that additional charge can be applied or injected to the cells, or the floating gates of the cells, and these cells may be referred to as programmable. By contrast, other memory cells in the portion of memory may be in a state such that no additional charge can be applied or injected to the cells, or the floating gates of the cells, and these cells may be referred to as non-programmable. In some instances, non-programmable memory cells may already be charged to a maximum charge, such that a maximum charge is stored on the floating gates. In such circumstances, applying charge to the portion of memory would apply or inject charge to programmable memory cells in the portion of memory, but not to non-programmable cells.

In some embodiments, applying charge to the portion of memory applies a programming operation (also referred to as a charge injection operation) to all memory cells in the portion of memory. In addition, in some embodiments, applying charge to the portion of memory applies a same programming voltage across the memory cells in the portion of memory. In some embodiments, charge is applied to the portion of memory independently of any data stored in the portion of memory and/or independently of the cell voltages of memory cells in the portion of memory.

Next, in some embodiments, after operation 504 has been performed for a sufficient amount of time, or for a sufficient number of iterations, the applied charge is determined to be sufficient (506—Yes) to have programmed memory cells in the portion of memory (e.g., selectable portion of storage medium 131, FIG. 1A) to above a pre-erase program threshold. In some embodiments, the method may include determining whether the memory cells in the portion of memory, or specifically the cell voltages of the memory cells, are above the pre-erase program threshold. For example, the storage device (e.g., storage device 120, FIG. 1A, or a component thereof such as management module 121-1, FIG. 1A) may determine the states of the memory cells in the portion of memory (e.g., by applying a reading threshold voltage as discussed above with reference to FIGS. 3A-3B). In some embodiments, the storage device may request or receive information (e.g., using storage medium interface 128, FIG. 1A) from the portion of memory about the cell voltages of the memory cells in the portion of memory. If the cell voltages are not (506—No) all or substantially all above the pre-erase program threshold (e.g., as shown in FIGS. 4B and 4C), the storage device may continue to apply charge (504) until the pre-erase program threshold is satisfied (506—Yes), in that the memory cells in the portion of memory are above the pre-erase program threshold.

In some embodiments, the applied charge may be applied using a continuous charge pulse or programming operation, while in some embodiments the applied charge may be applied using a plurality (e.g., a sequence) of charge pulses or programming operations. The charge pulses or programming operations may vary in duration and/or voltage. For example, referring back to FIG. 4B, distribution 410 represents the distribution of memory cell voltages after a first phase or duration of the pre-erase program operation. In some embodiments, the first phase or duration of the pre-erase program operation may be a first segment of a continuous charge pulse, while in some embodiments the first phase or duration may include a set of one or more charge pulses. Similarly, referring back to FIG. 4C, distribution 420 represents the distribution of memory cell voltages after an additional phase or duration of the pre-erase program operation. In some embodiments, the additional phase or duration may be an additional segment of a continuous charge pulse, while in some embodiments the additional phase or duration may include a set of one or more additional charge pulses.

In some embodiments, the applied charge is applied using one or more charge pulses having a cumulative duration of at least 5 milliseconds (ms). For example, the storage device (e.g., storage device 120, FIG. 1A, or a component thereof such as management module 121-1, FIG. 1A) may perform a pre-erase program operation on a portion of memory, such as a block or group of blocks, where the pre-erase program operation consists of a plurality of charge pulses or programming operations, such as 100 charge pulses or programming operations. In this example, the application of the 100 charge pulses is sufficient to program all or substantially all memory cells in the block (or group of blocks) to above the pre-erase program threshold. Further, in this example, each charge pulse completes in a predetermined amount of time, such as 100 microseconds (us). Thus, the pre-erase program operation completes in a total of 10 milliseconds (ms). Those skilled in the art will appreciate that applying charge—that is, the pre-erase program operation—may require more or less time depending on the requirements of the memory.

In some embodiments described above, the storage device may determine whether the memory cells are above the pre-erase threshold (e.g., by applying a reading threshold voltage as discussed above with reference to FIGS. 3A-3B) between one or more pairs of consecutive charge pulses in the sequence of applied charge pulses. It will be understood that numerous combinations may be made using one or more charge pulses or programming operations and, optionally, one or more determinations of whether the memory cells are above the pre-erase threshold.

Moreover, in some embodiments, applying charge to the portion of memory programs all programmable memory cells in the portion of non-volatile memory to a non-data state. In some embodiments, the non-data state includes all programmable cells having a threshold voltage above the pre-erase program threshold. In some embodiments, the non-data state includes a range of threshold voltages that extends above the cell voltages corresponding to the "10" state (e.g. as represented by distribution 430, FIG. 4D). In some embodiments, where memory cells are programmed to the non-data state, the non-data state is an indication that no information is stored in the memory cells.

After the pre-erase program operation is completed (504), such that the memory cells have cell voltages above the pre-erase program threshold (506—Yes), the storage device (e.g., storage device 120, FIG. 1A, or a component thereof such as management module 121-1, FIG. 1A) performs (508) an erase operation sufficient to remove charge from the memory cells in the portion of memory (e.g., selectable portion of storage medium 131, FIG. 1A) such that the memory cells have cell voltages below an erase threshold (e.g., a reading threshold voltage, such as reading threshold voltage $V_{RA}$, as discussed above with reference to FIGS. 3A-3B, or erase threshold 416, as discussed above with reference to FIG. 4E). In some embodiments, the erase operation sufficient to remove charge from the portion of memory to below the erase threshold is performed after a predetermined amount of time allowed for execution of the pre-erase program operation or after a predetermined number of charge pulses or programming operations (e.g., after completing step 504 using a predetermined amount of time or a predetermined number of charge pulses, method 500 proceeds directly from step 504 to step 508, without performing step 506). In other alternative embodiments, the distribution of cell voltages in the portion of memory is evaluated to determine whether the memory cells are sufficiently pre-programmed to enable secure erasing, and the erase operation is performed in accordance with such a determination or in accordance with a determination that the pre-erase program operation has completed or that the memory cells are above the pre-erase program threshold (e.g., method 500 may proceed from step 504 to step 506 before proceeding to step 508).

In some cases, the pre-erase program threshold is set based on the requirements of the secure erase command. For example, in some embodiments, a voltage distribution of memory cells similar to distribution 420, FIG. 4C, may be considered sufficiently pre-programmed to enable secure erasing of the memory cells. It is noted that in such an example, the pre-erase program threshold may be selected to be below the range of cell voltages corresponding to distribution 420.

As described above, removing charge from the portion of memory refers to changing the amount of charge on the floating gates of the programmable memory cells in the portion of memory, such that the cell voltages of the memory cells are reduced. In addition, as described above with respect to applying charge, in some embodiments, the erase operation sufficient to remove charge from the portion of memory to below the erase threshold may be performed using a plurality of erase pulses or erase operations. The erase pulses or operations may vary in duration and/or voltage.

Also, in some embodiments, the method may include determining whether the memory cells in the portion of memory, or specifically the cell voltages of the memory cells, are below the erase threshold. The storage device may determine the states of the memory cells in the portion of memory (e.g., by applying a reading threshold voltage as discussed above with reference to FIGS. 3A-3B or optionally by performing an erase verify operation). In some embodiments, the storage device may request or receive information (e.g., using storage medium interface 128, FIG. 1A) from the portion of memory about the cell voltages of the memory cells in the portion of memory. If the cell voltages are not all or substantially all below the erase threshold, the storage device may continue to remove charge until the erase threshold is satisfied.

Additional details concerning each of the processing steps for method 500, as well as details concerning additional processing steps, are presented below with reference to FIGS. 6A-6B.

Figure 6A:
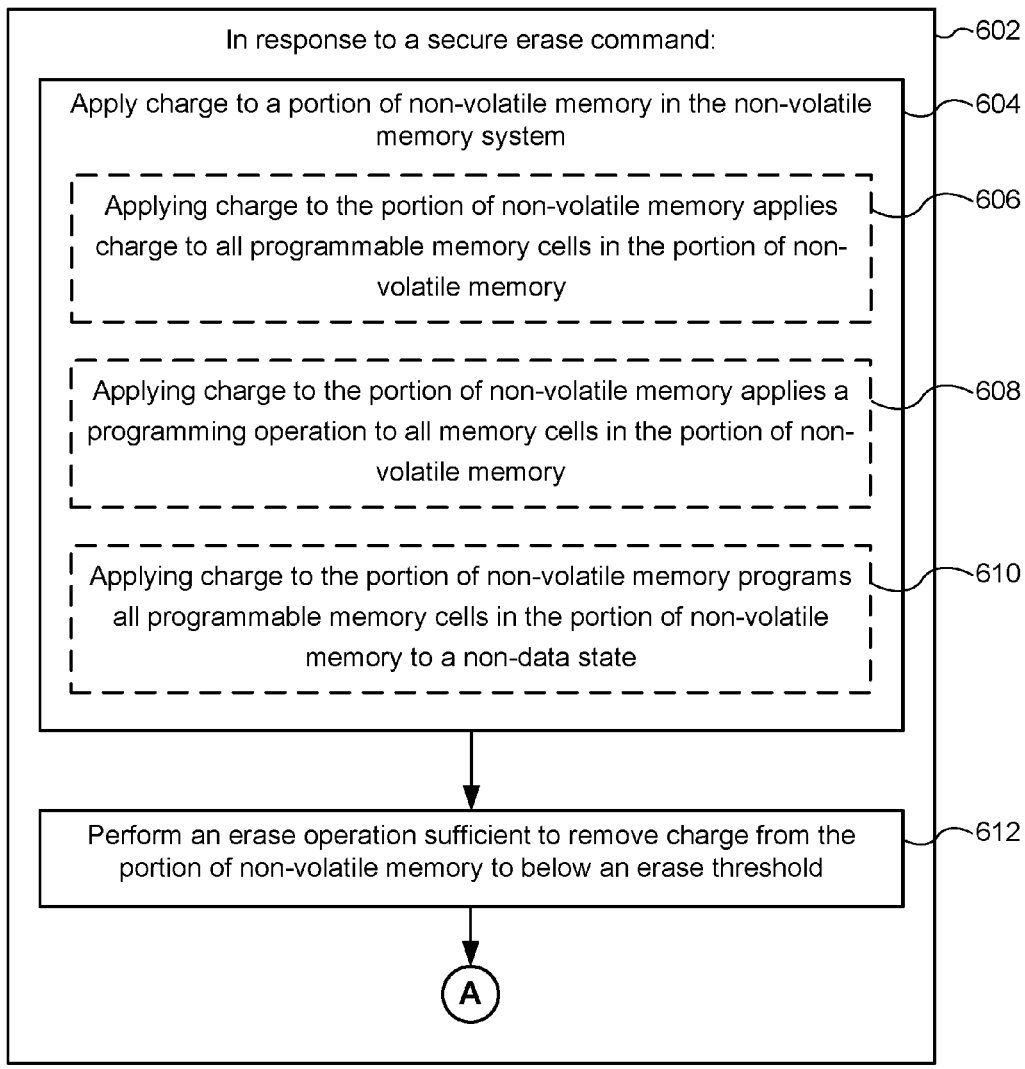
FIGS. 6A-6B illustrate a flowchart representation of a method of secure erasing in a non-volatile memory system, in accordance with some embodiments.
Figure 6B:
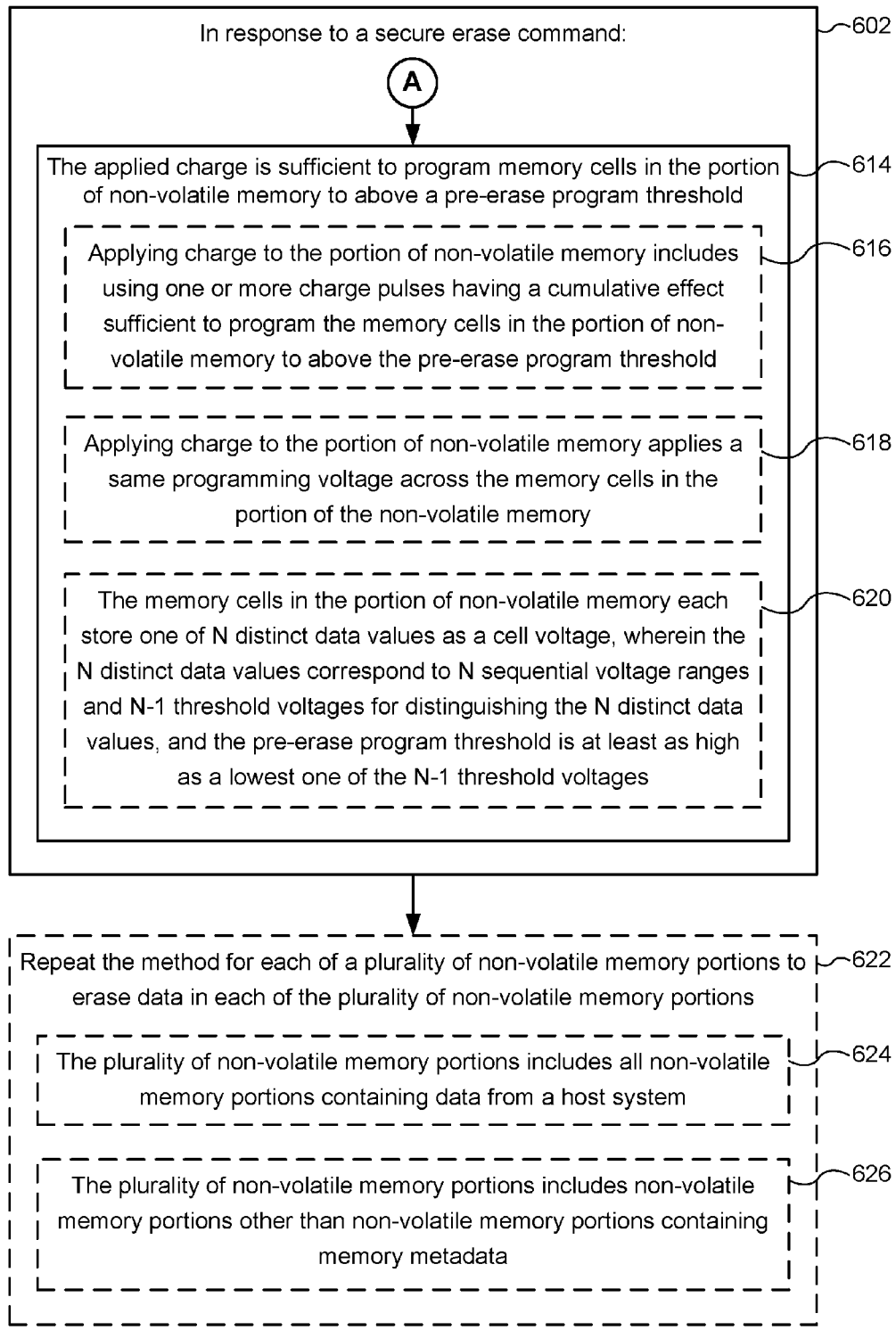

FIGS. 6A-6B illustrate a flowchart representation of a method of secure erasing in a non-volatile memory system, in accordance with some embodiments. With reference to the non-volatile memory system 100 pictured in FIGS. 1A and 1B, in some embodiments, a method 600 is performed by a storage device (e.g., storage device 120, FIGS. 1A and 1B) or one or more components of the storage device (e.g., storage controller 124 of storage device 120, FIG. 1A, memory controller 132 of storage device 120-1, FIG. 1B, or non-volatile memory controllers 135, FIG. 1B). In some embodiments, the method 600 is governed by instructions that are stored in a non-transitory computer-readable storage medium (e.g., controller memory 206, FIG. 2) and that are executed by one or more processors of a device, such as the one or more processing units (CPUs) 122-1 of management module 121-1 or the one or more processing units (CPUs) 137 of management modules 136 (FIG. 1B). In some embodiments, some of the operations of method 600 are performed at a host system (e.g., computer system 110, FIGS. 1A and 1B) that is operatively coupled with the storage device, and other operations of method 600 are performed at the storage device. In some embodiments, method 600 is governed, at least in part, by instructions that are stored in a non-transitory computer-readable storage medium and that are executed by one or more processors of the host system (the one or more processors of the host system are not shown in FIGS. 1A and 1B).

With reference to FIG. 2, in some embodiments, the operations of method 600 are performed, at least in part, by a secure erase module (e.g., secure erase module 220, FIG. 2), and a pre-erase program module (e.g., pre-erase program module 222, FIG. 2). For ease of explanation, the following describes method 600 as performed by a storage device (e.g., by storage device 120, FIG. 1A).

With reference to FIG. 6A, in some embodiments, the storage device (e.g., storage device 120, FIG. 1A, or a component thereof such as pre-erase program module 222, FIG. 2), in response to a secure erase command (602), applies (604) charge to a portion of non-volatile memory (e.g., selectable portion of storage medium 131, FIG. 1A) in the non-volatile memory system (e.g., non-volatile memory system 100, FIG. 1A), as explained above with reference to operation 504 of method 500. In some embodiments, applying charge to the portion of non-volatile memory applies (606) charge to all programmable memory cells (e.g., to the floating gates of all programmable memory cells) in the portion of non-volatile memory. In some embodiments, applying charge to the portion of non-volatile memory applies (608) a programming operation to all memory cells in the portion of non-volatile memory. In some embodiments, applying charge to the portion of non-volatile memory programs (610) all programmable memory cells in the portion of non-volatile memory to a non-data state.

Next, in some embodiments, the storage device (e.g., storage device 120, FIG. 1A, or a component thereof such as secure erase module 220, FIG. 2) performs (612) an erase operation sufficient to remove charge from the portion of non-volatile memory to below an erase threshold, as explained above with reference to operation 508 of method 500.

In some embodiments, the applied charge (applied during operation 604) is sufficient (614) to program memory cells in the portion of non-volatile memory to above a pre-erase program threshold, as explained above with reference to operation 506 of method 500. In some embodiments, applying charge to the portion of non-volatile memory includes (616) using one or more charge pulses having a cumulative effect sufficient to program the memory cells in the portion of non-volatile memory to above the pre-erase program threshold. In some embodiments, applying charge to the portion of non-volatile memory applies (618) a same programming voltage across the memory cells in the portion of the non-volatile memory. In some embodiments, the same programming voltage is applied across all cells in the portion of non-volatile memory. Moreover, in some embodiments, the memory cells in the portion of non-volatile memory each store (620) one of N distinct data values as a cell voltage, wherein the N distinct data values correspond to N sequential voltage ranges and N-1 threshold voltages for distinguishing the N distinct data values, and the pre-erase program threshold is at least as high as a lowest one of the N-1 threshold voltages. Alternatively, in various embodiments, the pre-erase program threshold is at least as high as a second lowest, third lowest, fourth lowest or highest one of the N-1 threshold voltages.

In some embodiments, the storage device repeats (622) the method 600 for each of a plurality of non-volatile memory portions to erase data in each of the plurality of non-volatile memory portions. In some embodiments, each non-volatile memory portion is a block, group of blocks, or die.

In some embodiments, the plurality of non-volatile memory portions includes (624) all non-volatile memory portions containing data from a host system (e.g., computer system 110, FIG. 1A). In some embodiments, the storage device may perform the method 600 to securely erase any non-volatile memory portions (e.g., blocks) containing data from one or more host systems after memory metadata from the memory portions has been moved to designated memory portions excluded from the secure erase operation. For example, the storage device may erase all blocks to which at least one logical address has been mapped in address translation tables (e.g., using address translation module 224, FIG. 2) of the non-volatile memory system (e.g., non-volatile memory system 100, FIG. 1A).

In some embodiments, the plurality of non-volatile memory portions includes (626) non-volatile memory portions other than non-volatile memory portions containing memory metadata. In some embodiments, the storage device may perform the method 600 to securely erase all non-volatile memory portions other than those designated to store memory metadata and excluded from the secure erase operation. Examples of such memory metadata include address translation mapping information, program/erase counts for respective blocks or groups of blocks, memory portion defect information (e.g., information indicating usable blocks), and the like. Alternatively, in response to the secure erase command, memory metadata may first be copied to a safe location and then restored to one or more non-volatile memory portions at the end of the secure erase operation.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the "second contact" are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of erasing data in a non-volatile memory system, the method comprising:
in response to a secure erase command:
applying charge to a portion of non-volatile memory in the non-volatile memory system; and
performing an erase operation sufficient to remove charge from the portion of non-volatile memory to below an erase threshold;
wherein the applied charge is sufficient to program memory cells in the portion of non-volatile memory to above a pre-erase program threshold; and
wherein:
the memory cells in the portion of non-volatile memory each store one of at least four distinct data values as a cell voltage, wherein the at least four distinct data values correspond to at least four sequential voltage ranges and at least three threshold voltages for distinguishing the at least four distinct data values; and
the pre-erase program threshold is at least as high as a second lowest one of the at least three threshold voltages.

2. The method of claim 1, wherein applying charge to the portion of non-volatile memory includes applying charge to all programmable memory cells in the portion of non-volatile memory.

3. The method of claim 1, wherein applying charge to the portion of non-volatile memory includes applying a programming operation to all memory cells in the portion of non-volatile memory.

4. The method of claim 1, wherein applying charge to the portion of non-volatile memory includes using one or more charge pulses having a cumulative effect sufficient to program the memory cells in the portion of non-volatile memory to above the pre-erase program threshold.

5. The method of claim 1, wherein applying charge to the portion of non-volatile memory includes programming all programmable memory cells in the portion of non-volatile memory to a non-data state.

6. The method of claim 1, wherein the pre-erase program threshold is at least as high as a highest one of the at least three threshold voltages.

7. The method of claim 1, further comprising repeating the method for each of a plurality of non-volatile memory portions to erase data in each of the plurality of non-volatile memory portions.

8. The method of claim 7, wherein the plurality of non-volatile memory portions includes all non-volatile memory portions containing data from a host system.

9. The method of claim 7, wherein the plurality of non-volatile memory portions includes non-volatile memory portions other than non-volatile memory portions containing memory metadata.

10. A non-volatile memory system, comprising:
a storage medium;
one or more processors; and
memory storing one or more programs, which when executed by the one or more processors cause the non-volatile memory system to:
in response to a secure erase command:
apply charge to a portion of non-volatile memory in the non-volatile memory system; and
perform an erase operation sufficient to remove charge from the portion of non-volatile memory to below an erase threshold;
wherein the applied charge is sufficient to program memory cells in the portion of non-volatile memory to above a pre-erase program threshold; and
wherein:
the memory cells in the portion of non-volatile memory each store one of at least four distinct data values as a cell voltage, wherein the at least four distinct data values correspond to at least four sequential voltage ranges and at least three threshold voltages for distinguishing the at least four distinct data values; and
the pre-erase program threshold is at least as high as a second lowest one of the at least three threshold voltages.

11. The non-volatile memory system of claim 10, wherein the one or more processors comprise one or more processors of a storage controller and the one or more programs include a pre-erase program module that applies charge to the portion of non-volatile memory in the non-volatile memory system and a secure erase module that performs an erase operation sufficient to remove charge from the portion of non-volatile memory to below the erase threshold.

12. The non-volatile memory system of claim 10, wherein applying charge to the portion of non-volatile memory includes applying charge to all programmable memory cells in the portion of non-volatile memory.

13. The non-volatile memory system of claim 10, wherein applying charge to the portion of non-volatile memory includes applying a programming operation to all memory cells in the portion of non-volatile memory.

14. The non-volatile memory system of claim 10, wherein applying charge to the portion of non-volatile memory includes using one or more charge pulses having a cumulative effect sufficient to program the memory cells in the portion of non-volatile memory to above the pre-erase program threshold.

15. The non-volatile memory system of claim 10, wherein applying charge to the portion of non-volatile memory includes programming all programmable memory cells in the portion of non-volatile memory to a non-data state.

16. The non-volatile memory system of claim 10, wherein the pre-erase program threshold is at least as high as a highest one of the at least three threshold voltages.

17. A non-transitory computer readable storage medium, storing one or more programs configured for execution by one or more processors of a non-volatile memory system, the one or more programs including instructions that when executed by the one or more processors cause the non-volatile memory system to:
in response to a secure erase command:
apply charge to a portion of non-volatile memory in the non-volatile memory system; and
perform an erase operation sufficient to remove charge from the portion of non-volatile memory to below an erase threshold;
wherein the applied charge is sufficient to program memory cells in the portion of non-volatile memory to above a pre-erase program threshold; and
wherein:
the memory cells in the portion of non-volatile memory each store one of at least four distinct data values as a cell voltage, wherein the at least four distinct data values correspond to at least four sequential voltage ranges and at least three threshold voltages for distinguishing the at least four distinct data values; and the pre-erase program threshold is at least as high as a second lowest one of the at least three threshold voltages.

18. The non-transitory computer readable storage medium of claim 17, wherein applying charge to the portion of non-volatile memory includes applying charge to all programmable memory cells in the portion of non-volatile memory.

19. The non-transitory computer readable storage medium of claim 17, wherein applying charge to the portion of non-volatile memory includes applying a programming operation to all memory cells in the portion of non-volatile memory.

20. The non-transitory computer readable storage medium of claim 17, wherein applying charge to the portion of non-volatile memory includes using one or more charge pulses having a cumulative effect sufficient to program the memory cells in the portion of non-volatile memory to above the pre-erase program threshold.

* * * * *